(12) United States Patent
Goedken et al.

(10) Patent No.: US 8,880,012 B2
(45) Date of Patent: Nov. 4, 2014

(54) METHOD AND APPARATUS FOR RESOURCE BLOCK BASED TRANSMITTER OPTIMIZATION IN WIRELESS COMMUNICATION DEVICES

(75) Inventors: Ryan J. Goedken, Lake Zurich, IL (US); Armin W. Klomsdorf, Chicago, IL (US); Thomas D. Nagode, Vernon Hills, IL (US); Dale G. Schwent, Schaumburg, IL (US)

(73) Assignee: Motorola Mobility LLC, Libertyville, IL (US)

( * ) Notice: Subject to any disclaimer, the term of this patent is extended or adjusted under 35 U.S.C. 154(b) by 190 days.

(21) Appl. No.: 13/353,390

(22) Filed: Jan. 19, 2012

(65) Prior Publication Data

US 2013/0187711 A1    Jul. 25, 2013

(51) Int. Cl.
*H01Q 11/12*  (2006.01)
*H04B 1/04*   (2006.01)

(52) U.S. Cl.
USPC ............... 455/127.2; 455/115.4; 455/240.1; 455/550.1

(58) Field of Classification Search
USPC .......... 455/115.1–115.4, 127.1, 127.2, 232.1, 455/234.1, 240.1, 323, 334, 339–341, 550.1
See application file for complete search history.

(56) References Cited

U.S. PATENT DOCUMENTS

| | | | |
|---|---|---|---|
| 6,160,449 A | 12/2000 | Klomsdorf et al. | |
| 6,166,598 A | 12/2000 | Schleuter | |
| 6,281,748 B1 | 8/2001 | Klomsdorf | |
| 6,417,736 B1 | 7/2002 | Lewyn | |
| 6,501,959 B1 * | 12/2002 | Seon | 455/522 |
| 7,315,730 B2 * | 1/2008 | Galan | 455/137 |
| 7,409,004 B2 * | 8/2008 | Booth et al. | 375/295 |
| 7,418,056 B2 * | 8/2008 | Suzuki et al. | 375/296 |
| 8,145,251 B2 | 3/2012 | Love et al. | |
| 8,380,145 B2 * | 2/2013 | Pratt et al. | 455/127.2 |
| 2004/0147276 A1 | 7/2004 | Gholmieh et al. | |
| 2005/0078743 A1 | 4/2005 | Shohara | |
| 2006/0178121 A1 | 8/2006 | Hamalainen et al. | |
| 2007/0173276 A1 | 7/2007 | Love et al. | |
| 2008/0025254 A1 | 1/2008 | Love et al. | |
| 2009/0004981 A1 | 1/2009 | Eliezer et al. | |
| 2009/0088093 A1 | 4/2009 | Nentwig | |

(Continued)

FOREIGN PATENT DOCUMENTS

EP    2296409 A1    3/2011

OTHER PUBLICATIONS

Mann, Stephen et al.: Increasing Talk-Time With Efficient Linear PA's, Tetra Market and Technology Developments (Ref. No. 2000/007), IEEE Seminar, Feb. 10, 2000, 22 pages.

(Continued)

*Primary Examiner* — Nhan Le
(74) *Attorney, Agent, or Firm* — Leydig, Voit & Mayer, Ltd.

(57) ABSTRACT

A method (700) and apparatus (600) optimize resource block based transmitter operation in a wireless communication device. The method can include receiving (720) a radio resource assignment including a particular resource block allocation. The method can include configuring (730) a wireless communication transceiver for the particular resource block allocation. The method can include degrading (740) power amplifier distortion of the wireless communication transceiver based on the particular resource block allocation. The power amplifier distortion can be a measure of a deviation of the power amplifier output in an analysis domain from an ideal linear amplifier.

15 Claims, 7 Drawing Sheets

(56) References Cited

U.S. PATENT DOCUMENTS

2011/0086599 A1 4/2011 Nentwig et al.
2011/0164659 A1* 7/2011 Kawamura et al. ........... 375/133
2011/0195741 A1 8/2011 Kim et al.

OTHER PUBLICATIONS

Hosein, Patrick et al. "Dynamic Power Headroom Threshold for Mobile Rate Determination in a CDMA Network", Vehicular Technology Conference, VTC 2004—Spring, IEEE 59th, May 17-19, 2004, 5 pages.

Motorola: "Comparison of PAR and Cubic Metric for Power Derating", TSG RAN WG1#37, Tdoc #R1-040642, Montreal, Canada, May 10-14, 2004, all pages.

Motorola: Comparison of PAR and Cubic Metric for Power De-Rating, TSG RAN WG#31, Tdoc R4-04367, Beijing, China, May 10-14, 2004, all pages.

Nick Cheng et al.: "Challenges and Requirements of Multimode Multiband Power Amplifiers for Mobile Applications", s Compound Semiconductor Integrated Circuit Symposium (CSICS), 2011 IEEE, IEEE, Oct. 16, 2011, all pages.

Patent Cooperation Treaty, International Search Report and Written Opinion of the International Searching Authority for International Application No. PCT/US2013/021113, Jul. 26, 2013, 12 pages.

* cited by examiner

METHOD AND APPARATUS FOR RESOURCE BLOCK BASED TRANSMITTER OPTIMIZATION IN WIRELESS COMMUNICATION DEVICES

BACKGROUND

1. Field

The present disclosure is directed to wireless communication transmitters. More particularly, the present disclosure is directed to adjusting transmitter power amplifiers based on resource block allocation to optimize a tradeoff between transmitter power amplifier linearity and transmitter power amplifier efficiency.

2. Introduction

Presently, wireless communication devices, such as handsets, mobile phones, personal digital assistants, tablets, laptop computers, and other wireless communication devices are used to wirelessly transmit communication signals over a network and between wireless communication devices and servers. New and future applications and services, such as streaming video and audio and large file transfers, as well as better voice quality, require higher and higher data rates for wireless transfer of the corresponding data. To transmit the data the wireless communication devices use power amplifiers to amplify the data communication signals.

Unfortunately, as data rates increase in wireless communication networks and handsets, power amplifier current drain tends to worsen. The power amplifier current drain worsens for two reasons. First, digitally modulated signals supporting high data rates have high peak to average ratios (PAR), meaning more linear headroom is needed in the power amplifier. This leads to LTE power amplifier efficiencies in the 40% range. This means more than half of the energy drawn out of the battery by the power amplifier is wasted as dissipated heat. In fact, the power amplifier is the largest current drain and heat contributor when a wireless device is transmitting at maximum power.

The second reason the power amplifier current drain worsens is because high data rate signals increase the probability of the wireless communication device transmitting at high output power. A first order analysis shows that in order to maintain a constant energy per bit, high bit rate signals need more transmit power. A deeper look reveals that higher order modulation types, such as 16-Quadrature Amplitude Modulation (16-QAM) vs. Quadrature Phase Shift Keying (QPSK) require a higher Signal to Noise Ratio (SNR) at the base station receiver. This means the wireless communication device requires more transmit power. Wider Resource Block (RB) allocations also require an increase in total transmit power to maintain a constant power per RB. The net effect of low power amplifier efficiency and high transmit power probability is a reduction in handset battery life, and an increase in heat dissipation.

Thus, there is a need for a method and apparatus for resource block based transmitter optimization in wireless communication devices.

BRIEF DESCRIPTION OF THE DRAWINGS

In order to describe the manner in which advantages and features of the disclosure can be obtained, a more particular description of the disclosure briefly described above will be rendered by reference to specific embodiments thereof which are illustrated in the appended drawings. Understanding that these drawings depict only typical embodiments of the disclosure and are not therefore to be considered to be limiting of its scope, the disclosure will be described and explained with additional specificity and detail through the use of the accompanying drawings in which.

DETAILED DESCRIPTION

A method and apparatus optimize resource block based transmitter operation in a wireless communication device. The method can include receiving a radio resource assignment including a particular resource block allocation. The method can include configuring a wireless communication transceiver for the particular resource block allocation. The method can include degrading power amplifier distortion of the wireless communication transceiver based on the particular resource block allocation. The power amplifier distortion can be a measure of a deviation of the power amplifier output in an analysis domain from an ideal linear amplifier.

Figure 1:
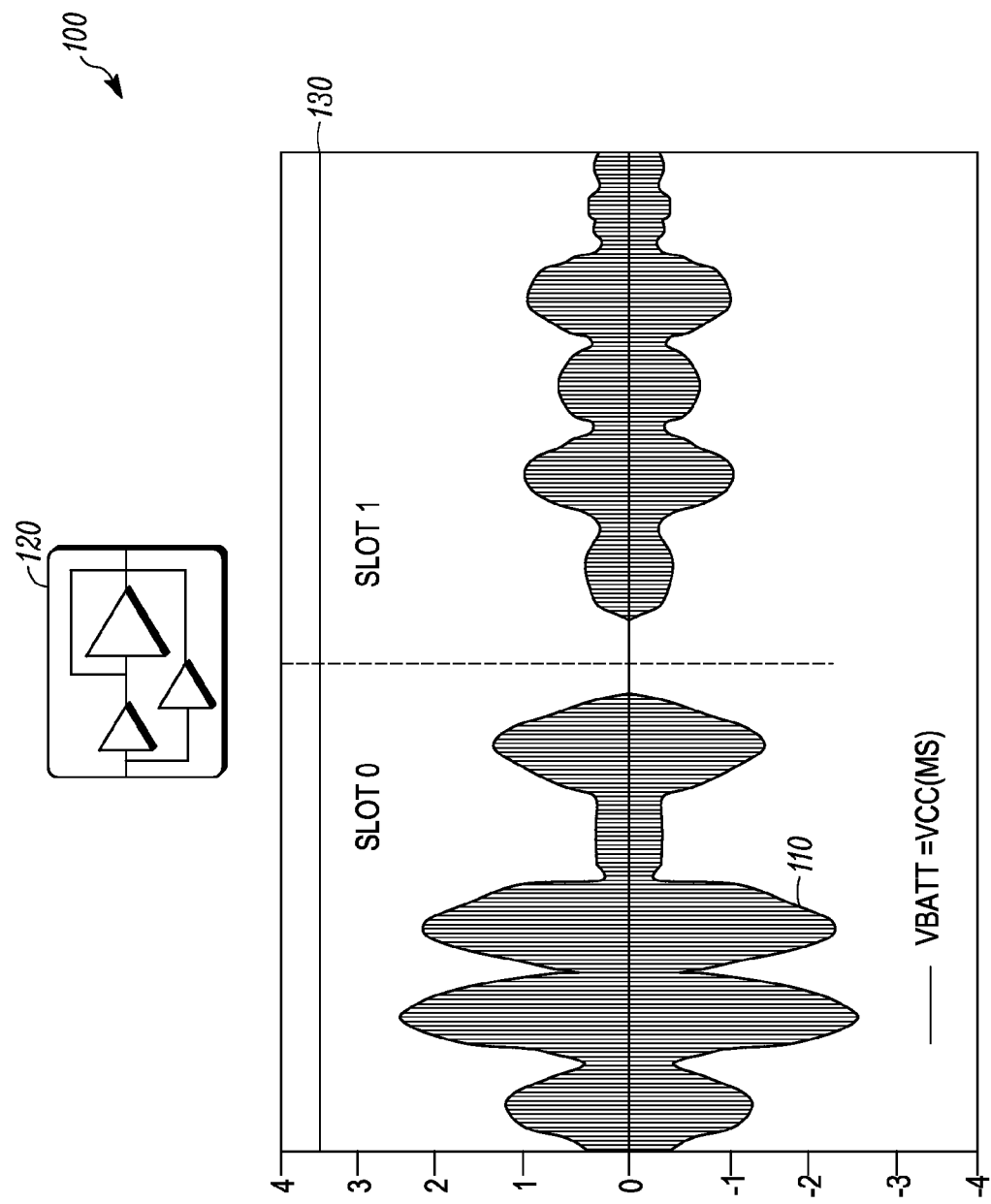
FIG. 1 is an example illustration of a time domain waveform of an amplitude modulated signal presented to a power amplifier for a multi-state power amplifier efficiency technique according to one embodiment.

FIG. 1 is an example illustration 100 of a time domain waveform of an amplitude modulated signal 110 presented to a power amplifier 120 for a multi-state power amplifier efficiency technique according to one embodiment. The amplitude modulated signal 110 can be a Wideband Code Division Multiple Access (WCDMA), such as a Quadrature Phase Shift Keying (QPSK) or a Hybrid Phase Shift Keying (HPSK), modulation signal, a Long Term Evolution (LTE) Orthogonal Frequency Division Multiple access (OFDM) or Single Carrier-Frequency Division Multiple access (SC-FDM) modulation signal, or any other amplitude modulated signal. The power amplifier 120 can be designed so that at maximum rated power, using a worst case Cubic Metric (CM) signal, the peak voltage of the amplitude modulated signal 110 aligns with the minimum supply voltage 130 of a mobile device handset battery. A small amount of clipping can be allowed, but too much clipping can cause the handset to fail Radio Frequency (RF) linearity specifications such as Adjacent Channel Leakage Ratio (ACLR) and Error Vector Magnitude (EVM), which are defined by 3GPP specifications and carrier requirements. Having excessive headroom in the power amplifier 120 so that none of the signal 110 is clipped can increase power amplifier current drain, which can result in shorter device battery life.

Figure 2:
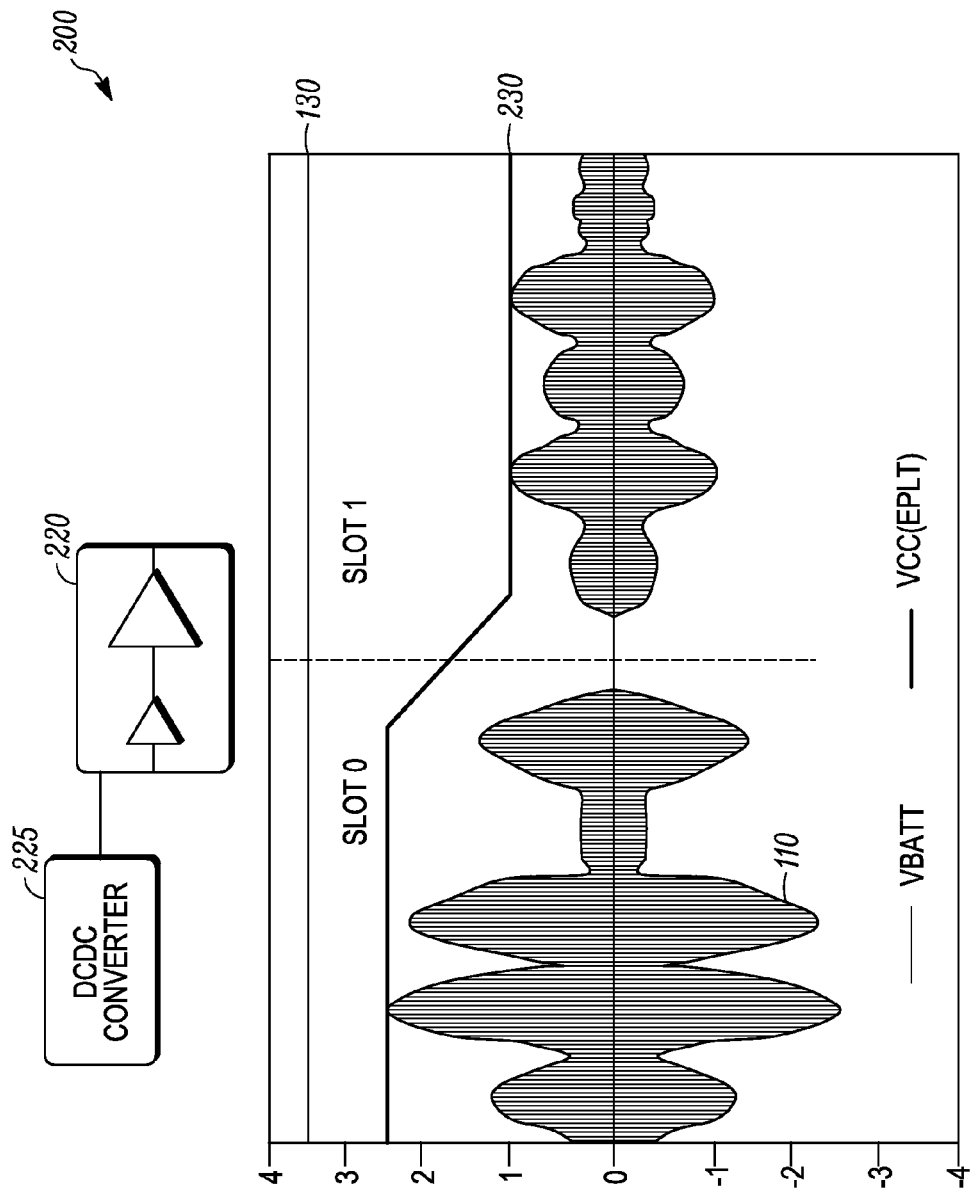
FIG. 2 is an example illustration of the time domain waveform of the amplitude modulated signal and a supply voltage presented to a power amplifier for an average power tracking efficiency technique according to one embodiment.

FIG. 2 is an example illustration 200 of the time domain waveform of the amplitude modulated signal 110, the supply voltage 130 of a mobile device handset battery, and a supply voltage 230 presented to a power amplifier 220 for an Average Power Tracking efficiency technique according to one embodiment. A Direct-Current-to-Direct-Current (DCDC) converter 225 can improve power amplifier current drain at backed off output power. As output power is reduced, amplitude peaks may no longer be compressed and ACLR can improve at the expense of optimal current drain. The DCDC converter 225 can degrade power amplifier distortion by efficiently lowering the supply voltage 230 to the power amplifier 220, to the point where amplitude peaks can be slightly clipped and ACLR can just meet the desired target. This can be referred to as Average Power Tracking (APT), to indicate that the DCDC supply voltage 230 is based on the average/root mean squared (RMS) power of the transmit signal 110.

Figure 3:
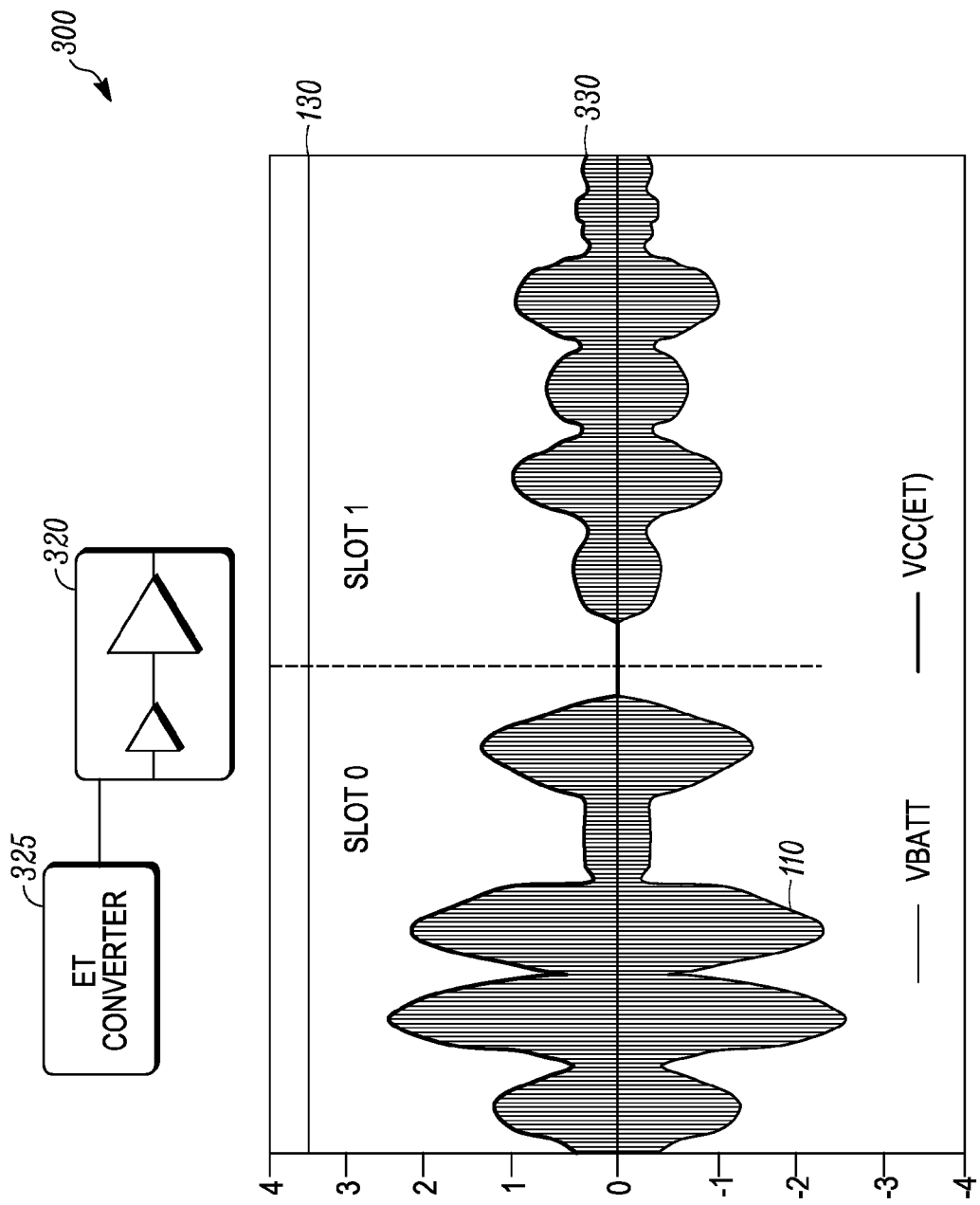
FIG. 3 is an example illustration of the time domain waveform of the amplitude modulated signal, and the supply voltage presented to a power amplifier for an envelope tracking efficiency technique according to one embodiment.

FIG. 3 is an example illustration 300 of the time domain waveform of the amplitude modulated signal 110, the supply voltage 130 of a mobile device handset battery, and the supply voltage 330 presented to a power amplifier 320 for an Envelope Tracking (ET) efficiency technique according to one embodiment. The ET efficiency technique can degrade power amplifier distortion to further improve power amplifier current drain. In this case the ET converter 325 can provide a fast, but still efficient, power supply 330 to track an envelope of the amplitude signal 110, in order to keep the power amplifier 320 in partial compression throughout the majority of the amplitude swing.

In addition to optimizing the DCDC voltage based on transmit power, as described by APT, the DCDC voltage can also be optimized based on signal type. U.S. patent application Ser. No. 10/954,583, filed Sep. 30, 2004, commonly assigned to the Assignee of the present application, and hereby incorporated by reference, describes how DCDC voltage can be adjusted based on the signal's Cubic Metric (CM) or PAR. For example, a WCDMA voice signal has a CM of 0 dB while a worst case HSPA+ signal has a CM of 3.5 dB. This means that at the same output power level, the DCDC voltage to the power amplifier can be set 3.5 dB or approximately 33% lower for the WCDMA Voice signal, resulting in a 33% power amplifier current drain savings. The Cubic Metric is already calculated by the Baseband Processor (BP) to calculate the allowable Max Power Reduction (MPR). For LTE signals, the CM is not commonly calculated, nor would it typically be appropriate to base MPR on the CM of LTE signals since the CM is constant across various Resource Block (RB) allocations, while the allowable MPR changes. For example, 3GPP specifications allow 10 MHz LTE channel bandwidths a 1 dB MPR for >12 RB allocations, and 0 dB MPR for <=12 RB allocations. The PAR and CM can be constant regardless of RB allocation.

Figure 4:
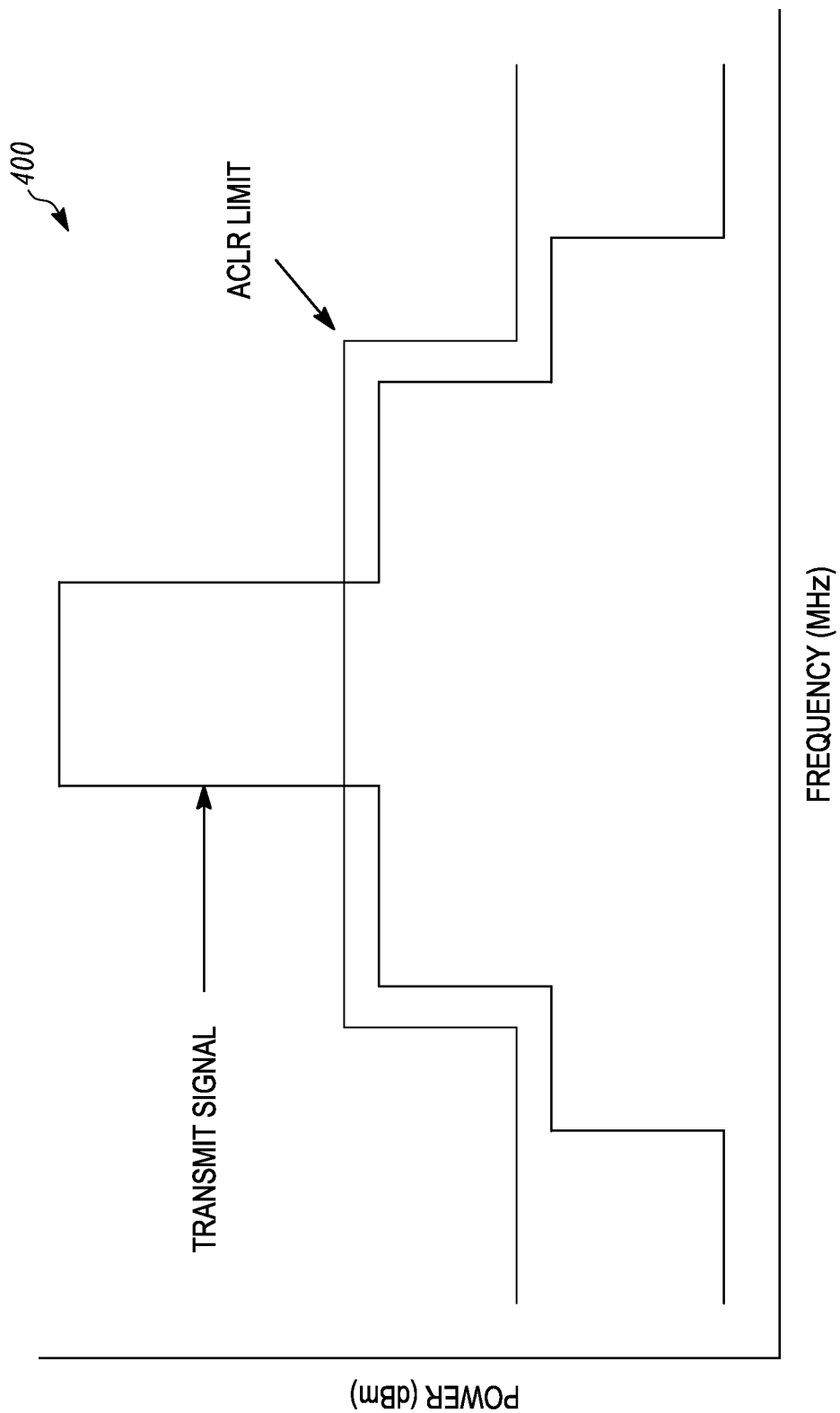
FIG. 4 is an example illustration of an adjacent channel leakage ratio spectrum for a wide resource block allocation according to one embodiment.
Figure 5:
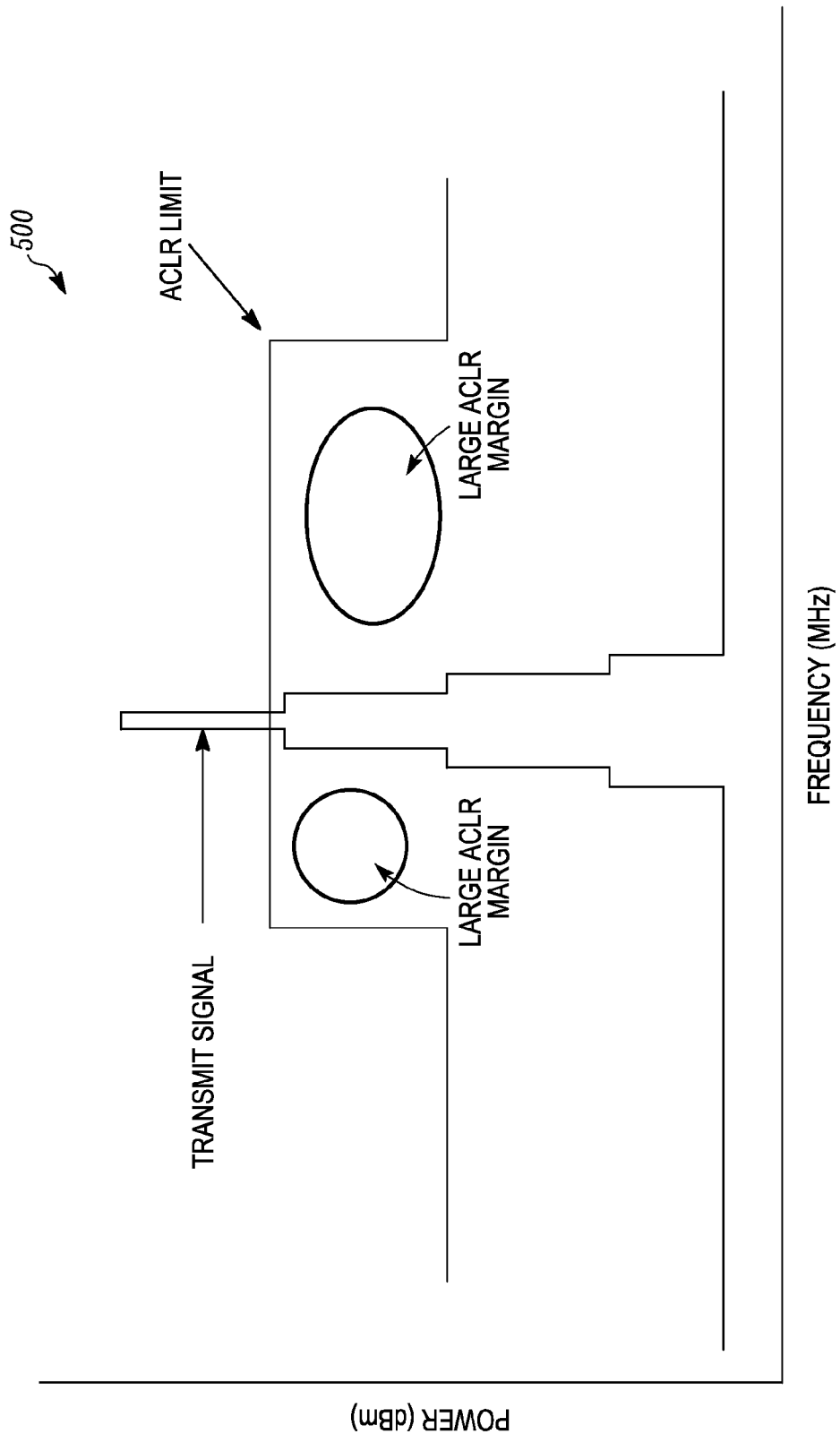
FIG. 5 is an example illustration of a typical adjacent channel leakage ratio spectrum for a narrow resource block allocation according to one embodiment.

FIG. 4 is an example illustration 400 of a typical Adjacent Channel Leakage Ratio (ACLR) spectrum for a wide Resource Block (RB) allocation according to one embodiment. FIG. 5 is an example illustration 500 of a typical adjacent channel leakage ratio (ACLR) spectrum for a narrow RB allocation according to one embodiment. The wide RB allocation typically has low margin to the ACLR spec, whereas the narrow RB allocation will have large ACLR margin. In one embodiment, APT DCDC voltage can be optimized based on RB allocation. A 10 MHz LTE signal with 50 RBs allocated can be allowed 1 dB MPR. In this condition, the power amplifier can already be optimized for the best ACLR/current drain tradeoff However, as the number of allocated RBs can be reduced towards 12, the ACLR margin can grow, and this ACLR margin can be traded off by reducing the DCDC supply voltage for improved current drain. At 12 RBs, 0 dB MPR can be allowed. For the case of 12 RBs at the edge of the Transmitter (Tx) channel, the power amplifier can again be optimized, meaning there may be no significant ACLR margin. However, as the number of allocated RBs are lowered further, the ACLR margin can grow, and this ACLR margin can be traded off for reduced power amplifier current. Additionally, if 12 RBs were placed near the center of the channel, a large ACLR margin can exist, and DCDC voltage can be lowered. RB allocations can be changed on a slot or frame basis, and the DCDC voltage can be optimized and set at the slot boundary when RB allocations change.

In another embodiment, an ET shaping table or look up table (LUT) can be adjusted to improve PA current drain at the expense of ACLR margin for RB allocations where significant ACLR margin exists. Large RB allocations typically need to use a less aggressive LUT due to Receive Band Noise implications. Imperfections in the ET system such as envelope/RF path amplitude or delay error, non-zero ET power supply impedance, and envelope signal distortion due to layout parasitics can degrade ACLR or create distortion which lands in the receive band, which degrades receiver (Rx) sensitivity. The ET system can be most sensitive to these imperfections when transmitting wide bandwidth signals that have fast amplitude modulation. For narrow RB allocations where the system is not as sensitive to ET imperfections, an aggressive LUT can be used that closely tracks the envelope modulation, and puts the power amplifier further into compression. Additional power amplifier compression can typically degrade ACLR, but narrow RB allocations can typically have a large ACLR margin to begin with. The additional power amplifier compression can improve power amplifier current drain by trading off excess ACLR margin.

Figure 6:
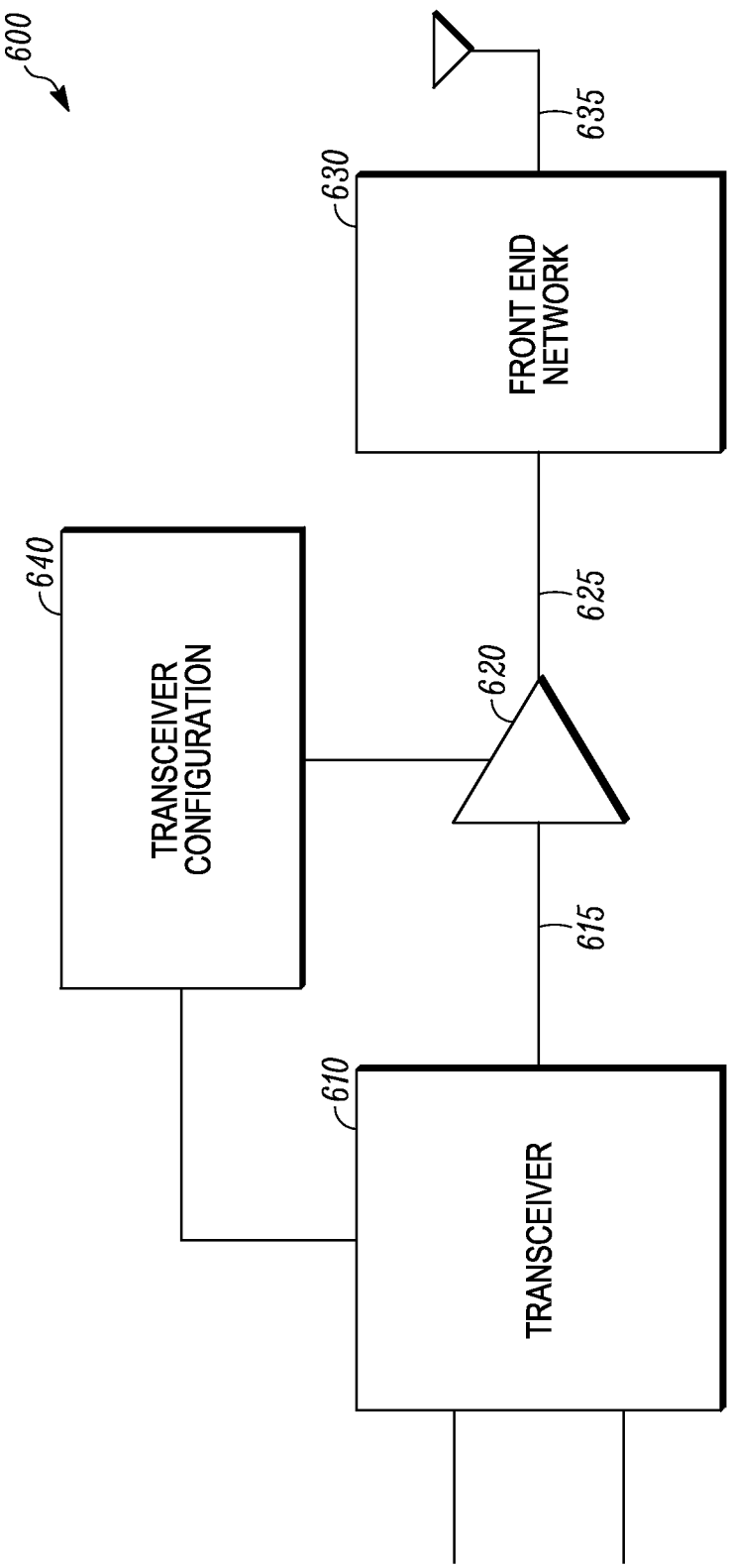
FIG. 6 is an example block diagram of a wireless communication device according to one embodiment.

FIG. 6 is an example block diagram of a wireless communication device 600 according to one embodiment. The wireless communication device 600 can include a wireless communication transceiver 610 configured to transmit wireless signals and configured to receive wireless communication signals including a radio resource assignment including a particular resource block allocation. The wireless communication transceiver 610 can have a transmitter output 615 coupled to a power amplifier 620. The power amplifier 620 can have an output 625 coupled to a front- end network 630 with an antenna 635. The power amplifier 620 can amplify transmitted signals from the wireless communication transceiver 610 to send the signals over a wireless network via the front-end network 630 and the antenna 635.

The wireless communication device 600 can include a transceiver configuration module 640 coupled to the power amplifier 620. The transceiver configuration module 640 can configure the wireless communication transceiver 610 for the particular resource block allocation. The transceiver configuration module 640 can also degrade power amplifier distortion of the power amplifier 620 based on the particular resource block allocation. The power amplifier distortion can be a measure of a deviation of the power amplifier output 625 in an analysis domain from an ideal linear amplifier. The transceiver configuration module 640 can degrade power amplifier distortion to minimize current drain in the power amplifier 620. The transceiver configuration module 640 can degrade power amplifier distortion based on a number and position of resource blocks in a signal transmitted by the wireless communication transceiver 610.

The transceiver configuration module 640 can also perform other operations and functions to execute all of the embodiments described herein. As an example, according to one embodiment, the transceiver configuration module 640 can include or can trigger operation of the DCDC converter 225 described above. For example, the transceiver configuration module 640 can degrade power amplifier distortion by adjusting an average power tracking by adjusting a power amplifier supply voltage to tradeoff increased efficiency for increased distortion. The transceiver configuration module 640 can degrade power amplifier distortion by adjusting an average power tracking direct-current-to-direct-current converter supply voltage to the power amplifier 620 based on the resource block allocation to degrade power amplifier distortion.

According to another embodiment the transceiver configuration module 640 can include or can trigger operation of the ET converter 325 described above. For example, the transceiver configuration module 640 can degrade power amplifier distortion by adjusting an envelope tracking power amplifier supply mapping based on the resource block allocation to degrade power amplifier distortion. The transceiver configuration module 640 can adjust the envelope tracking power amplifier supply mapping by adjusting a supply voltage applied to the power amplifier 620 in accordance with an envelope of an amplitude modulated radio-frequency signal.

Figure 7:
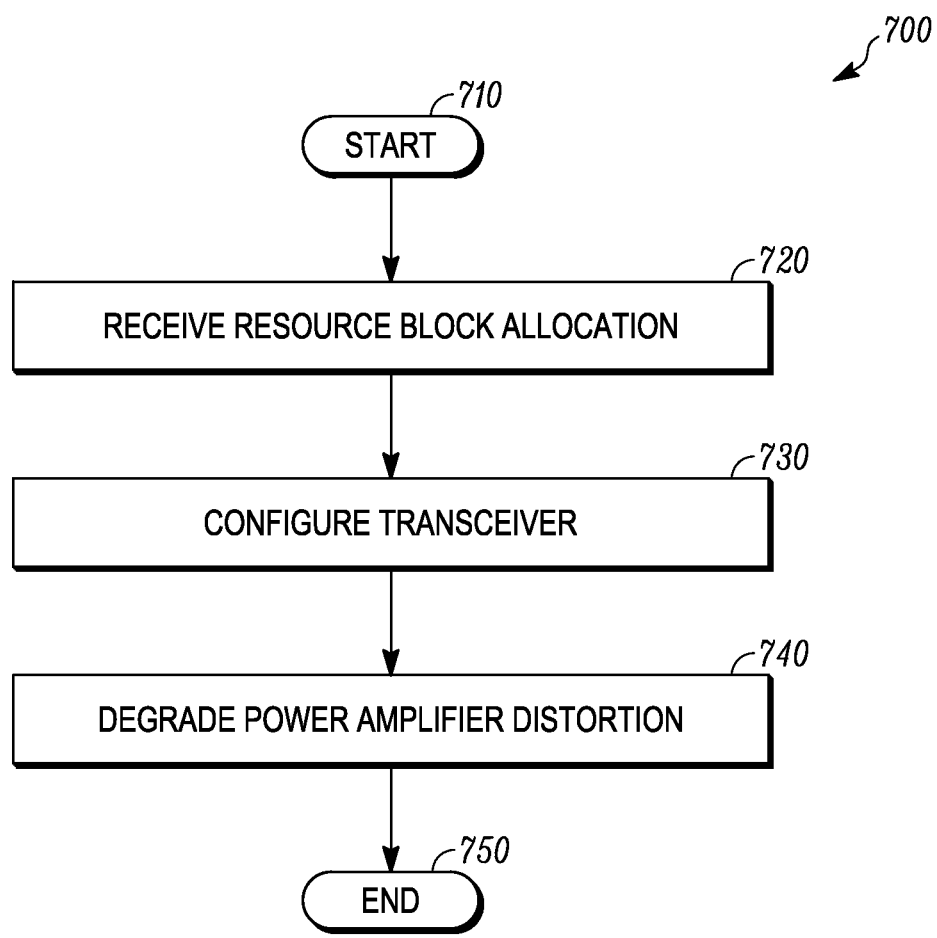
FIG. 7 is an exemplary flowchart illustrating the operation of the wireless communication device of FIG. 6 according to one embodiment.

FIG. 7 is an exemplary flowchart 700 illustrating the operation of the wireless communication device 600 according to one embodiment. At 710, the flowchart begins. At 720, a radio resource assignment including a particular resource block allocation can be received. The particular resource block allocation can be a particular long term evolution resource block allocation. The particular resource block allocation can also be any other wireless communication resource block allocation. Updates to a power amplifier linearity setting may be done at the slot or sub-frame boundary, where the LTE network is designed to allow power control updates. At 730, a wireless communication transceiver can be configured for the particular resource block allocation.

At 740, power amplifier distortion of the wireless communication transceiver can be degraded based on the particular resource block allocation to minimize current drain in the wireless communication transceiver. The power amplifier distortion can be a measure of a deviation of the power amplifier output in an analysis domain from an ideal linear amplifier. The analysis domain can be a time domain, a frequency domain, or any other domain useful for analysis of a deviation of the power amplifier output from an ideal linear amplifier. The power amplifier distortion may be degraded to cause degraded performance in measurements, such as adjacent channel leakage ratio, error vector magnitude, in band emissions, or out of band emissions such as spectrum emissions mask and receive band noise, and other degraded performance measurements.

The power amplifier distortion can be degraded based on a number and position of resource blocks in a signal transmitted by the wireless communication transceiver. For example, the number of resource blocks can be the number of separately modulated carriers in the transmitted signal.

The power amplifier distortion can be degraded by adjusting an average power tracking by adjusting a power amplifier supply voltage to tradeoff increased efficiency for increased distortion. For example at backed off power or for signals with low peak to average ratio, the power supply voltage can be lowered to the point where amplitude peak clipping degrades power amplifier linearity, such as adjacent channel leakage ratio, to a specified limit. To elaborate, the power amplifier distortion can be degraded by adjusting an average power tracking direct-current-to-direct-current converter supply voltage to the power amplifier based on the resource block allocation to degrade power amplifier distortion. The direct-current-to-direct-current (DCDC) voltage may be set based on a predefined look up table or the DCDC voltage may be adjusted automatically by using a measurement receiver to characterize power amplifier linearity on the fly.

Power amplifier distortion can also be degraded by adjusting an envelope tracking power amplifier supply mapping based on the resource block allocation to degrade power amplifier distortion. The supply mapping function may be stored in a look up table or as a transfer function with stored coefficients. An alternate look up table or transfer function with degraded linearity, but improved current drain, may have values that are pre-characterized based on lab measurements. Alternately, an active measurement system may be used to determine the amount of power amplifier distortion under current conditions, and the shaping function will be adjusted automatically to meet a predefined distortion limit.

The envelope tracking power amplifier supply mapping can also be adjusted by adjusting a supply voltage applied to the power amplifier in accordance with an envelope of an amplitude modulated radio-frequency signal. For example, the power amplifier instantaneous supply voltage can be set to the minimum allowable voltage for an instantaneous radio-frequency modulated voltage that can maintain power amplifier distortion, as measured by adjacent channel leakage ratio, error vector magnitude, in band emissions, or out of band emissions, such as spectrum emissions mask or receive band noise, below a desired target value. The supply voltage can also be adjusted by setting the supply voltage as low as possible to keep the power amplifier in partial compression. For example, the supply voltage can be as low as possible to keep the power amplifier in partial compression and to maximum efficiency throughout the amplitude swing range, without overly degrading amplifier linearity.

The envelope tracking power amplifier supply mapping can also be adjusted by selecting a corresponding instantaneous power amplifier supply voltage for each value of instantaneous radio-frequency modulated voltages. For example, a corresponding instantaneous power amplifier supply voltage can be selected for each value of an instantaneous radio-frequency modulated voltage to give an increase in power amplifier saturation, a lower envelope tracking null voltage, and/or higher power amplifier phase variation. At 750, the flowchart 700 ends.

According to some embodiments, an LTE scheduler can allocate any number of continuous Resource Blocks (RBs) to a wireless communication device. The device power amplifier can have large ACLR, EVM and IBE margin for narrow RB allocations, such as 13-20 dB ACLR power amplifier distortion margin, 5-10dB EVM and IBE margin for 1-3 RBs. Narrow RB allocations can be common for Voice Over Internet Protocol (VOIP), such as 1-3 RBs. Furthermore, narrow RB allocations will be prevalent for carrier Band 13 networks operating near public safety, LTE networks that are heavily loaded with multiple users, and LTE users that are far from the base station. The most common RB allocation for a data session may be 6 continuous RBs, which would have over 20 dB ACLR margin as long as the RBs are not at the channel edge.

According to some embodiments, either the power level tracking PLT supply voltage or the envelope tracking ET supply mapping can be adjusted based on LTE RB configuration and margin to distortion requirements. For PLT, the power amplifier supply voltage can be adjusted to tradeoff increased efficiency for increased distortion. Power amplifier efficiency can increase approximately 12% for each 3-5dB increase in distortion. For ET, a more aggressive power amplifier mapping function can be used. The mapping function can be chosen to achieve constant power amplifier gain while staying within the chipset envelope bandwidth capability and maintaining a target power amplifier phase change. If, for specific RB allocations, distortion margin exists, the power amplifier supply mapping can follow a more aggressive mapping, such as with higher power amplifier saturation, lower null voltage, and higher power amplifier phase change. At least an additional 12% efficiency improvement can be achieved through more aggressive power amplifier supply mapping vs. standard mapping.

The method of this disclosure is preferably implemented on a programmed processor. However, the controllers, flowcharts, and modules may also be implemented on a general purpose or special purpose computer, a programmed microprocessor or microcontroller and peripheral integrated circuit elements, an integrated circuit, a hardware electronic or logic circuit such as a discrete element circuit, a programmable logic device, or the like. In general, any device on which resides a finite state machine capable of implementing the flowcharts shown in the figures may be used to implement the processor functions of this disclosure.

While this disclosure has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, the preferred embodiments of the disclosure as set forth herein are intended to be illustrative, not limiting. Various changes may be made without departing from the spirit and scope of the disclosure.

In this document, relational terms such as "first," "second," and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising."

We claim:

1. A method in a wireless communication transceiver, the method comprising:
   receiving a radio resource assignment including a particular resource block allocation;
   configuring the wireless communication transceiver for the particular resource block allocation; and
   degrading power amplifier distortion of the wireless communication transceiver based on the particular resource block allocation, wherein degrading the power amplifier distortion comprises adjusting an average power tracking direct-current-to-direct-current converter supply voltage to the power amplifier based on the particular resource block allocation.

2. The method according to claim 1, wherein degrading power amplifier distortion further comprises degrading power amplifier distortion to minimize current drain in the wireless communication transceiver.

3. The method according to claim 1, wherein degrading power amplifier distortion further comprises degrading power amplifier distortion based on a number and position of resource blocks in a signal transmitted by the wireless communication transceiver.

4. The method according to claim 1, wherein degrading power amplifier distortion further comprises adjusting the average power tracking by adjusting a power amplifier supply voltage to tradeoff increased efficiency for increased distortion.

5. The method according to claim 1, wherein degrading power amplifier distortion further comprises adjusting an envelope tracking power amplifier supply mapping based on the resource block allocation to degrade power amplifier distortion.

6. The method according to claim 5, wherein adjusting an envelope tracking power amplifier supply mapping comprises adjusting a supply voltage applied to the power amplifier in accordance with an envelope of an amplitude modulated radio-frequency signal.

7. The method according to claim 6, wherein the supply voltage is adjusted by setting the supply voltage as low as possible to keep the power amplifier in partial compression.

8. The method according to claim 5, wherein adjusting an envelope tracking power amplifier supply mapping comprises selecting a corresponding instantaneous power amplifier supply voltage for each value of instantaneous radio-frequency modulated voltages.

9. The method according to claim 1, wherein the particular resource block allocation comprises a particular long term evolution resource block allocation.

10. A wireless communication device comprising:
    a wireless communication transceiver configured to transmit wireless signals and configured to receive wireless communication signals including a radio resource assignment including a particular resource block allocation;
    a power amplifier coupled to the transceiver, the power amplifier configured to amplify transmitted signals from the wireless communication transceiver; and
    a transceiver configuration module coupled to the power amplifier, the transceiver configuration module configured to:
    configure the wireless communication transceiver for the particular resource block allocation, and
    degrade power amplifier distortion of the power amplifier based on the particular resource block allocation, wherein degrading the power amplifier distortion comprises adjusting an average power tracking direct-current-to-direct-current converter supply voltage to the power amplifier based on the particular resource block allocation.

11. The wireless communication device according to claim 10, wherein the transceiver configuration module is further configured to degrade power amplifier distortion to minimize current drain in the power amplifier.

12. The wireless communication device according to claim 10, wherein the transceiver configuration module is further configured to degrade power amplifier distortion based on a number and position of resource blocks in a signal transmitted by the wireless communication transceiver.

13. The wireless communication device according to claim 10, wherein the transceiver configuration module is further configured to degrade power amplifier distortion by adjusting an average power tracking by adjusting a power amplifier supply voltage to tradeoff increased efficiency for increased distortion.

14. The wireless communication device according to claim 10, wherein the transceiver configuration module is further configured to degrade power amplifier distortion by adjusting an envelope tracking power amplifier supply mapping based on the resource block allocation to degrade power amplifier distortion.

15. The wireless communication device according to claim 14, wherein the transceiver configuration module is further configured to adjust the envelope tracking power amplifier supply mapping by adjusting a supply voltage applied to the power amplifier in accordance with an envelope of an amplitude modulated radio-frequency signal.

* * * * *